(12) United States Patent
Amano et al.

(10) Patent No.: US 11,489,081 B2
(45) Date of Patent: Nov. 1, 2022

(54) PHOTOELECTRIC CONVERSION DEVICE AND METHOD OF MANUFACTURING PHOTOELECTRIC CONVERSION DEVICE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Akio Amano, Machida (JP); Kenji Todori, Yokohama (JP); Kenji Fujinaga, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

(*) Notice: Subject to any disclaimer, the term of this patent is extended or adjusted under 35 U.S.C. 154(b) by 4 days.

(21) Appl. No.: 17/013,248

(22) Filed: Sep. 4, 2020

(65) Prior Publication Data
US 2020/0403108 A1 Dec. 24, 2020

Related U.S. Application Data

(63) Continuation of application No. PCT/JP2019/011596, filed on Mar. 19, 2019.

(51) Int. Cl.
*H01L 31/0224* (2006.01)
*H01L 31/18* (2006.01)
(Continued)

(52) U.S. Cl.
CPC ........ *H01L 31/022466* (2013.01); *H01L 31/022425* (2013.01); *H01L 31/032* (2013.01);
(Continued)

(58) Field of Classification Search
CPC ......... H01L 31/022466; H01L 31/0328; H01L 31/1884; H01L 31/022425; H01L 51/44; Y02P 70/50; Y02E 10/549
(Continued)

(56) References Cited

U.S. PATENT DOCUMENTS 6,080,928 A 6/2000 Nakagawa
9,818,892 B2 * 11/2017 Park .................. H01L 31/02245
(Continued)

FOREIGN PATENT DOCUMENTS

JP 2-100375 A 4/1990
JP 9-82998 A 3/1997
(Continued)

OTHER PUBLICATIONS

International Search Report dated Jun. 4, 2018 in PCT/JP2019/011596 filed Mar. 19, 2019 (with English Translation of Categories of Cited Documents), 3 pages.
(Continued)

*Primary Examiner* — David Vu
*Assistant Examiner* — Brandon C Fox
(74) *Attorney, Agent, or Firm* — Oblon, McClelland, Maier & Neustadt, L.L.P.

(57) ABSTRACT

A photoelectric conversion device includes: a substrate; a first photoelectric conversion element including a first substrate electrode, a first photoelectric conversion layer, and a first counter electrode; a second photoelectric conversion element including a second substrate electrode, a second photoelectric conversion layer, and a second counter electrode; and a connection including a groove, a conductive portion and a conductive layer, the conductive portion being provided in the groove and including a part of the first counter electrode, and the conductive portion and the conductive layer electrically connecting the first counter elec-
(Continued)

trode and the second substrate electrode. The conductive layer overlaps the first counter electrode on an edge of the groove, and a total thickness of the conductive portion and the conductive layer is larger than a thickness of the first counter electrode.

8 Claims, 5 Drawing Sheets

(51) Int. Cl.
  *H01L 31/0328* (2006.01)
  *H01L 31/032* (2006.01)
  *H01L 51/44* (2006.01)
(52) U.S. Cl.
  CPC ...... *H01L 31/0328* (2013.01); *H01L 31/1884* (2013.01); *H01L 51/44* (2013.01); *Y02E 10/549* (2013.01); *Y02P 70/50* (2015.11)
(58) Field of Classification Search
  USPC .......................................................... 257/431
  See application file for complete search history.

(56) References Cited

U.S. PATENT DOCUMENTS

| | | | |
|---|---|---|---|
| 10,128,392 B2* | 11/2018 | Bosman | H01L 31/022433 |
| 10,644,179 B1* | 5/2020 | Bush | H01L 27/301 |
| 2007/0193619 A1* | 8/2007 | Shinohara | H01L 31/076 |
| | | | 257/E27.125 |
| 2010/0258167 A1* | 10/2010 | Chang | H01L 31/0392 |
| | | | 136/254 |
| 2012/0204931 A1 | 8/2012 | Seike | |
| 2014/0230891 A1 | 8/2014 | Park | |
| 2016/0276611 A1 | 9/2016 | Oooka et al. | |
| 2018/0090711 A1 | 3/2018 | Gotanda et al. | |
| 2018/0211792 A1 | 7/2018 | Mori et al. | |
| 2018/0277788 A1* | 9/2018 | Huang | H01L 51/5206 |
| 2019/0019843 A1 | 1/2019 | Fujinuma et al. | |
| 2019/0081194 A1* | 3/2019 | Oooka | H01L 31/04 |
| 2019/0088417 A1 | 3/2019 | Mori et al. | |
| 2019/0198259 A1 | 6/2019 | Aranami | |
| 2020/0279958 A1* | 9/2020 | Yoneyama | H01L 31/046 |

FOREIGN PATENT DOCUMENTS

| | | |
|---|---|---|
| JP | 2011-135027 A | 7/2011 |
| JP | 2012-038853 A | 2/2012 |
| JP | 5715795 B2 | 5/2015 |
| JP | 2016-178172 A | 10/2016 |
| JP | 6030176 B2 | 11/2016 |
| JP | 2018-56213 A | 4/2018 |
| JP | 6408042 B2 | 10/2018 |
| JP | 2019-54086 A | 4/2019 |
| JP | 6530360 B2 | 6/2019 |
| JP | 6600670 B2 | 10/2019 |
| WO | WO 2017/159192 A1 | 9/2017 |
| WO | WO 2017/190787 | 11/2017 |
| WO | WO 2018/043644 A1 | 3/2018 |

OTHER PUBLICATIONS

Martin A. Green, et al., "The Emergence of Perovskite Solar Cells", Nature Photonics, vol. 8, No. 7, Jul. 2014, pp. 506-514.

* cited by examiner

PHOTOELECTRIC CONVERSION DEVICE AND METHOD OF MANUFACTURING PHOTOELECTRIC CONVERSION DEVICE

CROSS-REFERENCE TO RELATED APPLICATIONS

This application is a continuation of prior International Application No. PCT/JP2019/011596 filed on Mar. 19, 2019; the entire contents of all of which are incorporated herein by reference.

FIELD

Embodiments of the present invention relate to a photoelectric conversion device and a method of manufacturing the photoelectric conversion device.

BACKGROUND

For a perovskite photovoltaic module, an inexpensive coating method is applicable to formation of an active layer or the like of the photovoltaic module, and it is possible to substantially reduce a forming cost of the active layer or the like. In that respect, the perovskite photovoltaic module is expected as a next-generation photovoltaic module which is low in cost and harmless.

A cell constituting a photovoltaic module has a structure in which a substrate electrode and a counter electrode sandwich an active layer. At present, since the substrate electrode at a practical level does not have a sufficient conductivity, an efficiency of retrieving a generated electric charge to the outside deteriorates as a cell area is increased. As a constituent material of the substrate, there is used a conductive metal oxide, a conductive polymer, a carbon material, or the like, or further, a material obtained by compounding a metal nanowire or the like with the above. Thus, it is general to form the photovoltaic module by aligning a plurality of strip-shaped cells and to connect the plurality of cells in series. The photovoltaic module having the plurality of cells is formed by a method described hereinafter, for example. Substrate electrodes of respective cells are formed on a substrate. A photoelectric conversion layer is applied and formed on an entire surface on the plurality of substrate electrodes. Parts of the photoelectric conversion layer are scribed so as to form groves to expose the substrate electrodes. Counter electrodes are formed in correspondence to the respective cells on the photoelectric conversion layer having the scribe grooves. On this occasion, by filling the counter electrode of the adjacent cell in the scribe groove, the counter electrode of the adjacent cell and the substrate electrode exposed in the scribe groove are electrically connected. The counter electrodes are formed in an electrically separated state per the module by usage of masked vapor deposition, for example, or are electrically separated per the module later by scribing, for example.

DETAILED DESCRIPTION

Figure 1:
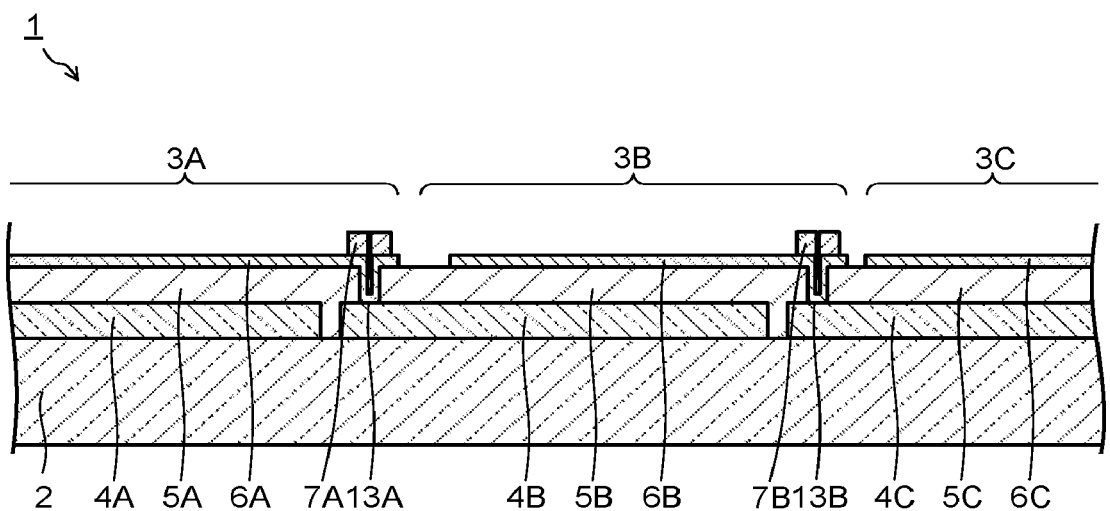
FIG. 1 is a cross-sectional schematic view illustrating a structural example of a photoelectric conversion device.

A photoelectric conversion device includes: a substrate; a first photoelectric conversion element including a first substrate electrode provided on the substrate, a first photoelectric conversion layer disposed on the first substrate electrode, and a first counter electrode disposed on the first photoelectric conversion layer; a second photoelectric conversion element including a second substrate electrode provided adjacent to the first substrate electrode on the substrate and electrically insulated from the first substrate electrode, a second photoelectric conversion layer disposed on the second substrate electrode, and a second counter electrode disposed on the second photoelectric conversion layer; and a connection including a groove, a conductive portion and a conductive layer, the groove penetrating the second photoelectric conversion layer from a surface to expose a surface of the second substrate electrode from the second photoelectric conversion layer, the conductive portion being provided in the groove and including a part of the first counter electrode, the conductive layer being provided on the conductive portion, and the conductive portion and the conductive layer electrically connecting the first counter electrode and the second substrate electrode. The conductive layer overlaps the first counter electrode on an edge of the groove, and a total thickness of the conductive portion and the conductive layer is larger than a thickness of the first counter electrode.

Hereinafter, photoelectric conversion devices of embodiments and manufacturing methods thereof will be described with reference to the drawings. Note that in each embodiment, the same reference numeral is given to practically the same component and explanation thereof may be partially omitted. The drawings are schematic and a relationship between a thickness and a plan dimension, a ratio of thicknesses of respective portions, and so on may be different from real ones. A term indicating a direction such as up/down in explanation indicates a relative direction in a case where a surface of a later-described substrate on which a photoelectric conversion element is formed is defined as up, unless clearly notified in particular, and may be different from a real direction based on a gravitational acceleration direction.

FIG. 1 is a cross-sectional schematic view illustrating a structural example of the photoelectric conversion device. A photoelectric conversion device 1 illustrated in FIG. 1 has a substrate 2 functioning as a support substrate and a plurality of photoelectric conversion elements 3 (3A, 3B, 3C) disposed on the substrate 2. The photoelectric conversion elements 3 have substrate electrodes 4 (4A, 4B, 4C), photoelectric conversion layers 5 (5A, 5B, 5C), and counter electrodes 6 (6A, 6B, 6C) which are each provided on the substrate 2. Further, the photoelectric conversion device 1 has connections 13 (13A, 13B) which have dividing grooves 11 (11A, 11B) exposing surfaces of the substrate electrodes and conductive layers 7 (7A, 7B) provided in the dividing grooves 11 and which electrically connects two photoelectric conversion elements 3.

In this embodiment there is described an example of a mode in which light incidence and emission is performed on a substrate 2 side by using a transparent substrate as the substrate 2 and forming a transparent substrate electrode 4 on the substrate 2, but a reverse mode may be applied. That is, the mode is applicable in which a photoelectric conversion layer 5 is formed on an opaque substrate 2 and a substrate electrode 4 is formed thereon.

The substrate 2 is constituted by a material having a light transmitting property and an insulating property. As a constituent material of the substrate 2, there is used an inorganic material such as non-alkali glass, quartz glass, or sapphire, or an organic material such as polyethylene (PE), polyethylene terephthalate (PET), polyethylene naphthalate (PEN), polyimide, polyamide, polyamide-imide, or liquid crystal polymer. The substrate may be a rigid substrate made of an inorganic material or an organic material, for example, or may be a flexible substrate made of an organic material or an ultrathin inorganic material.

In a case where the photoelectric conversion device 1 of the embodiment is a photovoltaic module, light is irradiated to the photoelectric conversion layer 5 via the substrate 2 and the substrate electrode 4. In a case where the photoelectric conversion device 1 is a light emitting element, light generated by the photoelectric conversion layer 5 is emitted via the substrate 2 and the substrate electrode 4. In the case where the photoelectric conversion device 1 is the photovoltaic module, the light irradiated to the photoelectric conversion layer 5 causes charge separation, which generates an electron and a hole to be a pair therewith. Of the electron and the hole generated by the photoelectric conversion layer 5, the electron is collected by the substrate electrode 4 and the hole is collected by the counter electrode 6, for example. Functions of the substrate electrode 4 and the counter electrode 6 may be reversed. Hereinafter, those respective parts will be described.

The substrate electrode 4 is constituted by a material having a light transmitting property and a conductivity, for example. As a constituent material of the substrate electrode 4, there is used a conductive metal oxide such as indium oxide, zinc oxide, tin oxide, indium tin oxide (ITO), fluorine-doped tin oxide (FTO), gallium-doped zinc oxide (GZO), aluminum-doped zinc oxide (AZO), indium-zinc oxide (IZO), or indium-gallium-zinc oxide (TGZO), a conductive polymer such as poly(3,4-ethylenedioxythiophene)/poly(4-styrenesulfonic acid) (PEDOT/PSS), or a carbon material such as graphene. It is possible to use a conductive nano-material such as a silver nanowire, a gold nanowire, or a carbon nanotube by mixing it in the aforementioned material. Further, the substrate electrode 4 may be a stacked film made of a layer constituted by the aforementioned material and a metal layer constituted by metal such as gold, platinum, silver, copper, cobalt, nickel, indium, or aluminum, or an alloy containing such metal, in a range where the light transmitting property can be maintained. The substrate electrode 4 is formed by a vacuum deposition method, a sputtering method, an ion plating method, a chemical vapor deposition (CVD) method, a sol-gel method, a plating method, a coating method, or the like, for example.

A thickness of the substrate electrode 4 is not limited in particular, but is preferably 10 nm or more and 1 μm or less, and further preferably 30 nm or more and 300 nm or less. When the film thickness of the substrate electrode 4 is too small, a sheet resistance becomes high. When the film thickness of the substrate electrode 4 is too large, the light transmittance is reduced and flexibility is lowered, so that a crack is likely to occur by a stress. For the substrate electrode 4, it is preferable to choose the film thickness so as to achieve both high light transmittance and low sheet resistance. The sheet resistance of the substrate electrode 4 is not limited in particular, but is normally 1000Ω/□ or less, preferably 500Ω/□ or less, and more preferably 200Ω/□ or less. In a case of a current-driven type element such as a photovoltaic module or a light emitting element, the sheet resistance is further preferable to be 50Ω/□ or less.

The photoelectric conversion layer 5 is disposed between a pair of opposing electrodes at least either one of which is the substrate electrode, and has a first intermediate layer (first buffer layer) disposed between the substrate electrode 4 and the photoelectric conversion layer 5, and a second intermediate layer (second buffer layer) disposed between the photoelectric conversion layer 5 and the counter electrode 6. The intermediate layer is disposed as necessary, and both or one of the respective intermediate layers is dispensable depending on the circumstances. Each layer constituting the element is appropriately selected in correspondence to a device (photovoltaic module, light emitting element, photosensor, or the like) to which the photoelectric conversion device is applied. Hereinafter, a case where the photoelectric conversion device is used as the photovoltaic module is mainly described, but the photoelectric conversion device of the embodiment can be applied to the light emitting element, the photosensor, or the like.

The photoelectric conversion layer 5 has an active layer having a perovskite compound, for example. The perovskite compound is represented by a composition formula: $ABX_3$, where A denotes at least one cation selected from the group consisting of monovalent cations, B denotes at least one cation selected from the group consisting of divalent cations, and X denotes at least one selected from the group consisting of halogen anions. Examples of A include at least one cation selected from the group consisting of methylammonium cation, formamidinium cation, potassium ion, rubidium ion, and cesium ion. Examples of B include at least one cation selected from the group consisting of lead ion, germanium ion, and tin ion. Examples of X include at least one halogen selected from the group consisting of iodine, bromine, and chlorine.

The active layer having the perovskite compound is preferably formed by using a two-step method, for example. The two-step method is a method of forming a $BX_2$ compound layer as a first step and providing an AX compound on the $BX_2$ compound layer as a second step, to make them react and form an active layer containing a perovskite compound. The method is not limited to the above, and an active layer may be formed by using a method of vacuum depositing or a method of heating and drying an applied solution.

The counter electrode 6 is constituted by a material having a conductivity, and under certain circumstances, having a light transmitting property. As a constituent material of the counter electrode 6, there is used metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing the above, a conductive metal oxide such as indium-zinc oxide (IZO), a conductive polymer such as PEDOT/PSS, or a carbon material such as graphene, for example. It is possible to use a conductive nano-material such as a silver nanowire, a gold nanowire, or a carbon nanotube by mixing it in the aforementioned material. The counter electrode 6 is formed by a vacuum deposition method, a sputtering method, an ion plating method, a sol-gel method, a plating method, a coating method, or the like, for example.

A larger average thickness of the counter electrode 6 is more preferable, since the counter electrode 6 is preferable to be low in resistance in a case of a common photovoltaic module, but thinning of the counter electrode 6 enables an increase in light transmittance of the counter electrode 6, and thus the counter electrode 6 is required to be formed thin in a case of producing a transparent photovoltaic module. For example, when a silver electrode is used as a counter electrode, a thickness is preferably 50 nm or less, and further preferably 20 nm or less. The above is not necessarily applicable when a transparent electrode which originally has a high light transmitting property such as ITO is used as a counter electrode. The light transmittance of the counter electrode 6 is preferable to be 10% or more, for example. The light transmittance is measured by using an ultraviolet-visible spectrophotometer, for example.

A sheet resistance of the counter electrode 6 is preferably 1000Ω/□ or less, and more preferably 50Ω/□ or less.

Figure 2:
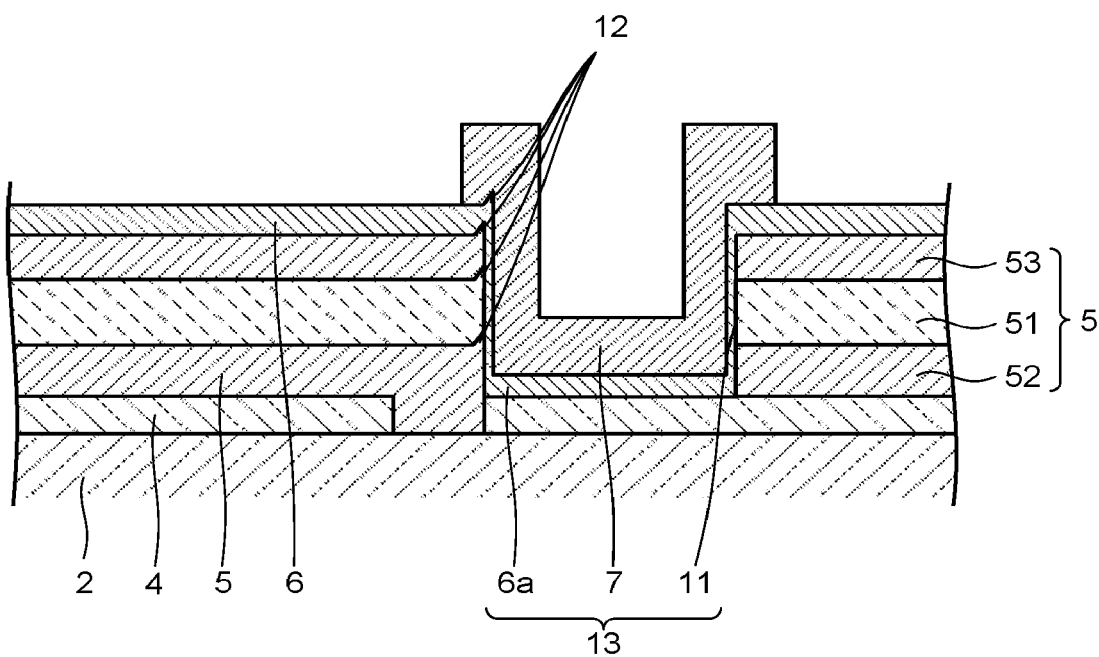
FIG. 2 is a cross-sectional schematic view illustrating a structural example of a photoelectric conversion layer and a connection.

FIG. 2 is a cross-sectional schematic view illustrating a structural example of the photoelectric conversion layer 5 and the connection 13. The photoelectric conversion layer 5 has an active layer 51, an intermediate layer 52 disposed between the substrate electrode 4 and the active layer 51, and an intermediate layer 53 disposed between the active layer 51 and the counter electrode 6.

As the active layer 51, an active layer containing the above-described perovskite compound, for example, can be used. A thickness of the active layer 51 is not limited in particular, but is preferably 10 nm or more and 1000 nm or less. The intermediate layer 52 and the intermediate layer 53 are disposed as necessary, and both or either one of them is dispensable depending on the circumstances.

In a case where the electron is collected by the substrate electrode 4, of the electron and the hole generated by the photoelectric conversion layer 5, the intermediate layer 52 is constituted by a material capable of transporting the electron selectively and efficiently. As a constituent material of the intermediate layer 52 functioning as an electron transport layer, there can be cited an inorganic material such as zinc oxide, titanium oxide, or gallium oxide, an organic material such as polyethyleneimine or its derivative, and a carbon material such as the aforementioned fullerene derivative, but the constituent material is not limited in particular.

In a case where the hole is collected by the substrate electrode 4, the intermediate layer 52 is constituted by a material capable of transporting the hole selectively and efficiently. As a constituent material of the intermediate layer 52 functioning as a hole transport layer, there can be cited an inorganic material such as nickel oxide, copper oxide, vanadium oxide, tantalum oxide, or molybdenum oxide, and an organic material such as polythiophene, polypyrrole, polyacetylene, triphenylenediaminepolypyrrol, polyaniline, or a derivative of the above, but the constituent material is not limited in particular.

In a case where the hole is collected by the counter electrode 6, of the electron and the hole generated by the photoelectric conversion layer 5, the intermediate layer 53 is constituted by a material capable of transporting the hole selectively and efficiently. A constituent material of the intermediate layer 53 functioning as the hole transport layer is similar to the constituent material of the intermediate layer 52. In a case where the electron is collected by the counter electrode 6, the intermediate layer 53 is constituted by a material capable of transporting the electron selectively and efficiently. A constituent material of the intermediate layer 53 functioning as the electron transport layer is similar to the constituent material of the intermediate layer 52.

The intermediate layer 52 and the intermediate layer 53 are formed by a vacuum deposition method, a sputtering method, an ion plating method, a CVD method, a sol-gel method, a plating method, a coating method, or the like, for example. Thicknesses are each preferably 1 nm or more and 200 nm or less.

In view of a performance of the photoelectric conversion device, a lower resistance of the counter electrode 6 is more preferable, but thinning of the counter electrode 6 for the sake of lowering the resistance causes the following problem. As a method of dividing the photoelectric conversion layer 5, there is used mechanical scribing by using a cutting tool, laser scribing by using laser, or the like, but in both methods, in first scribing to expose the substrate electrode 4 in order to expose the substrate electrode 4, a projection (burr 12) of a film may occur on an edge portion of the dividing groove 11, that is, in an end portion of the photoelectric conversion element 3 as illustrated in FIG. 2, by an impact of scribing, so that flatness of an upper surface of the photoelectric conversion element 3 is sometimes impaired notably by the burr 12 of the end portion. Note that the burr 12 is not necessarily required to exist.

When the counter electrode 6 is formed by a vacuum process, electrical continuity is formed between the end portion of the photoelectric conversion element 3 and the substrate electrode 4 via the dividing groove 11 by the counter electrode 6 formed by the vacuum process. However, if the counter electrode 6 is thinned, by the burr 12 and a level difference between the upper surface of the photoelectric conversion element 3 and the substrate electrode 4, there may occur benching of a conductive portion, a reduction of the property as the photoelectric conversion device due to an electrical bottleneck caused by thinning of the counter electrode 6, or a reduction of a yield.

In a general photoelectric conversion device, since a counter electrode 6 having sufficient thickness and electric conductivity is formed, electrical connection between the counter electrode 6 and a substrate electrode 4 is not impaired even if a burr 12 is formed on an edge of a dividing groove 11, but when a thin-film metal electrode or the like is used as the counter electrode 6, for example, for the sake of forming a photoelectric conversion device with a high light transmittance, existence of a burr 12 cannot be ignored in order to secure electrical connection between the counter electrode 6 and the substrate electrode 4. As described above, it is necessary to suppress a connection resistance between the counter electrode 6 and the substrate electrode 4 from becoming high due to making the counter electrode 6 thinner or lower in resistance.

In contrast, the connection 13 illustrated in FIG. 2 has the dividing groove 11, a conductive portion 6a made of a part of the counter electrode 6 provided in the dividing groove 11, and a conductive layer 7 provided in the dividing groove 11. The connection 13 electrically connects the counter electrode 6 of one of the photoelectric conversion elements 3 and the substrate electrode 4 of another photoelectric conversion element 3 by the conductive portion 6a and the conductive layer 7.

The conductive layer 7 is provided on the conductive portion 6a, extends along an inner wall surface of the dividing groove 11, and overlaps one of the counter electrodes 6 in the edge of the dividing groove 11. Note that the conductive layer 7 may overlap an end portion adjacent to the photoelectric conversion layer 5 other than one of the photoelectric conversion layers 5.

For the conductive layer 7, a material applicable to the counter electrode 6, for example, can be used. A total thickness of the conductive portion 6a and the conductive layer 7 is preferably larger than the thickness of the counter electrode 6. Thereby, a connection resistance between the counter electrode 6 and the substrate electrode 4 in the connection 3 can be lowered. An average thickness of the conductive layer 7 is preferable to be 30 nm or more and 1000 nm or less, for example.

A sheet resistance of the conductive layer 7 is preferably 1000Ω/□ or less and more preferably 50Ω/□ or less. A light transmittance of the conductive layer 7 may be less than 10%. For example, by forming the counter electrode 6 having a light transmittance of 10% or more and the conductive layer 7 having a light transmittance of less than 10%, the counter electrode 6 and the conductive layer 7 can be discriminated based on a difference in light transmittance.

Figure 3A:
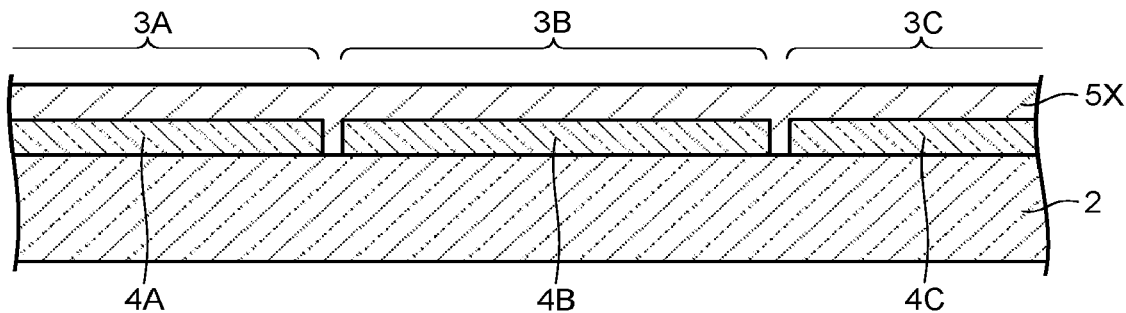
FIGS. 3A to 3D are cross-sectional views for explaining a manufacturing method example of the photoelectric conversion device.

Next, a manufacturing method example of the photoelectric conversion device 1 will be described as a manufacturing method example of the photoelectric conversion device of the embodiment. FIG. 3A to FIG. 3D are schematic views for explaining the manufacturing method example of the photoelectric conversion device 1. In the manufacturing method example of the photoelectric conversion device 1, as illustrated in FIG. 3A, substrate electrodes 4A, 4B, 4C corresponding to a plurality of photoelectric conversion elements 3A, 3B, 3C are formed on the substrate 2. The substrate electrode 4B is formed in a state of being adjacent to the substrate electrode 4A and separate from the substrate electrode 4A, that is, in a state of being electrically insulated. Similarly, the substrate electrode 4C is formed in a state of being adjacent to the substrate electrode 4B and separate from the substrate electrode 4B, that is, in a state of being electrically insulated. A photoelectric conversion layer 5X is formed on the substrate 2 in a manner to overlap the substrate electrodes 4A, 4B, 4C. The photoelectric conversion layer 5X is formed on an entire surface to overlap all the substrate electrodes 4A, 4B, 4C.

Figure 3B:
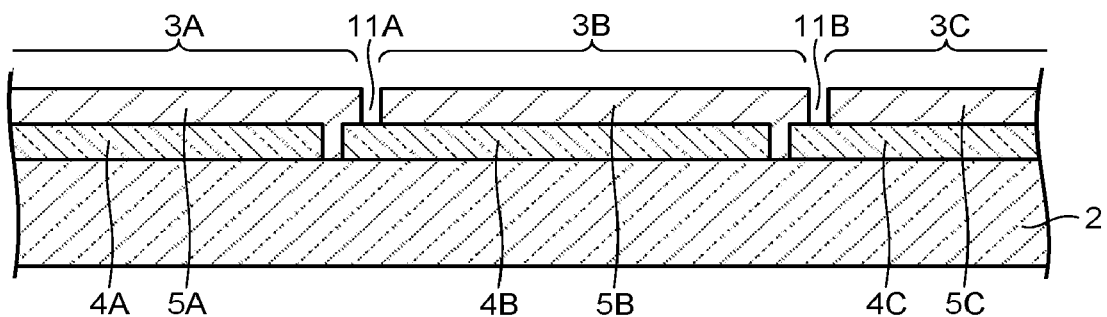

Next, as illustrated in FIG. 3B, the photoelectric conversion layer 5X is cut to form dividing grooves 11A, 11B so as to divide the photoelectric conversion layer 5X into a plurality of layers to correspond to the respective photoelectric conversion elements 3A, 3B, 3C. The dividing grooves 11A, 11B which divide the photoelectric conversion layer 5X are formed by a scribing method such as mechanical scribing or laser scribing, for example. By dividing the photoelectric conversion layer 5X into the plurality of layers by the scribe grooves (dividing grooves) 11A, 11B, photoelectric conversion layers 5A, 5B, 5C corresponding to the plurality of photoelectric conversion elements 3A, 3B, 3C are formed. The dividing grooves 11A, 11B are forming regions of the electrical connections 13A, 13B between the counter electrodes 6A, 6B of the photoelectric conversion elements 3A, 3B and the substrate electrodes 4B, 4C of the adjacent photoelectric conversion elements 3B, 3C. Therefore, the dividing grooves 11A, 11B are formed in a manner that surfaces of the substrate electrodes 4B, 4C are exposed.

Figure 3C:
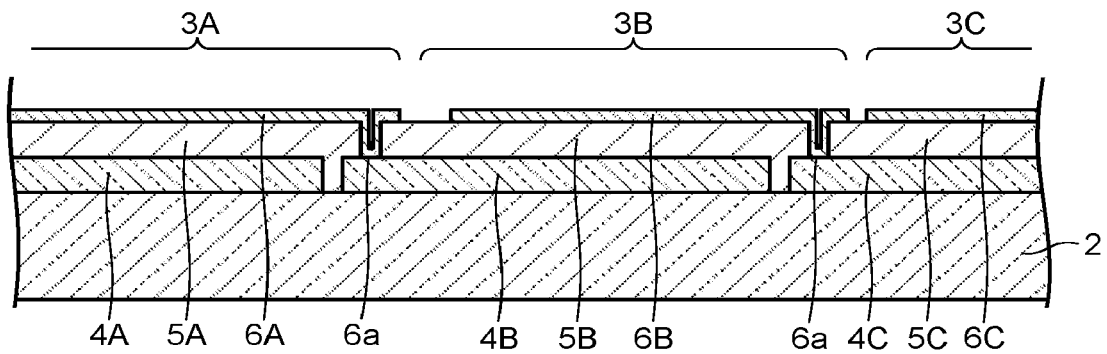

Next, as illustrated in FIG. 3C, counter electrodes 6A, 6B, 6C corresponding to the plurality of photoelectric conversion elements 3A, 3B, 3C respectively are formed on the photoelectric conversion layers 5A, 5B, 5C. In forming the counter electrodes 6A, 6B of the photoelectric conversion elements 3A, 3B, parts (conductive portions 6a) of the counter electrodes 6A, 6B are embedded in the dividing grooves 11A, 11B provided between the photoelectric conversion elements 3A, 3B and the adjacent photoelectric conversion elements 3B, 3C. In this way, the counter electrodes 6A, 6B of the photoelectric conversion elements 3A, 3B and the substrates electrodes 4B, 4C of the adjacent photoelectric conversion elements 3B, 3C are electrically connected by the conductive portions 6a filled in the dividing grooves 11A, 11B. Note that parts of the intermediate layer 53 may be embedded in the dividing grooves 11A, 11B. Dividing of the counter electrodes 6A and 6B may be done by mask film-formation, and also may be done by using mechanical scribing or laser scribing after formation of a large film.

Figure 3D:
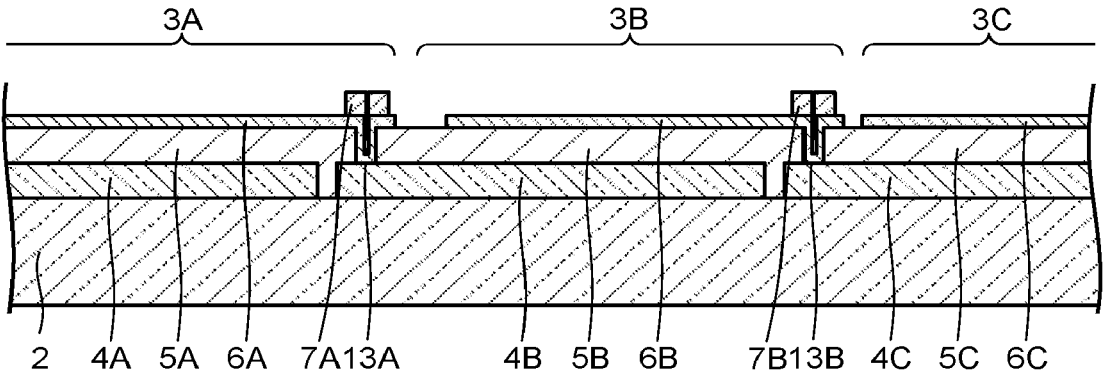

Next, as illustrated in FIG. 3D, conductive layers 7A, 7B are formed in the dividing grooves 11A, 11B provided between the photoelectric conversion elements 3A, 3B and the adjacent photoelectric conversion elements 3B, 3C. In this way, the counter electrodes 6A, 6B of the photoelectric conversion elements 3A, 3B and substrates electrodes 4B, 4C of the adjacent photoelectric conversion elements 3B, 3C are electrically connected by the conductive portions 6a filled in the dividing grooves 11A, 11B and the conductive layers 7A, 7B. Note that parts of the intermediate layer 53 may be embedded in the dividing grooves 11A, 11B.

Figure 4:
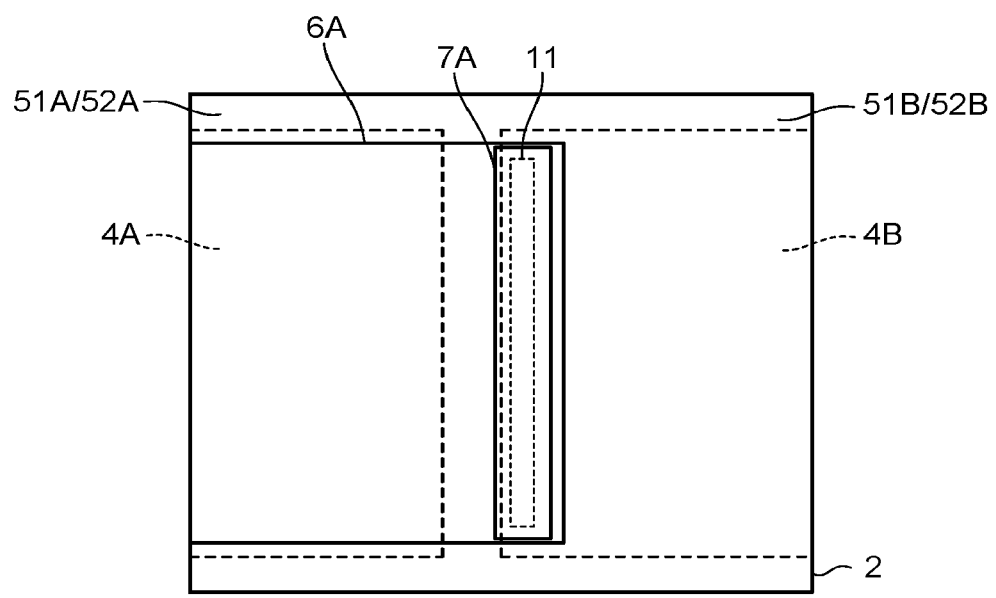
FIG. 4 is a plan view for explaining the manufacturing method example of the photoelectric conversion device.

FIG. 4 is a plan view for explaining the manufacturing method example of the photoelectric conversion device 1. As illustrated in FIG. 4, the conductive layer 7A may be formed in a rectangular shape. A width of the conductive layer 7 is preferably larger than a width of the dividing groove 11, and preferably, for example, larger by 100 μm or more than the width of the dividing groove 11.

Figure 5:
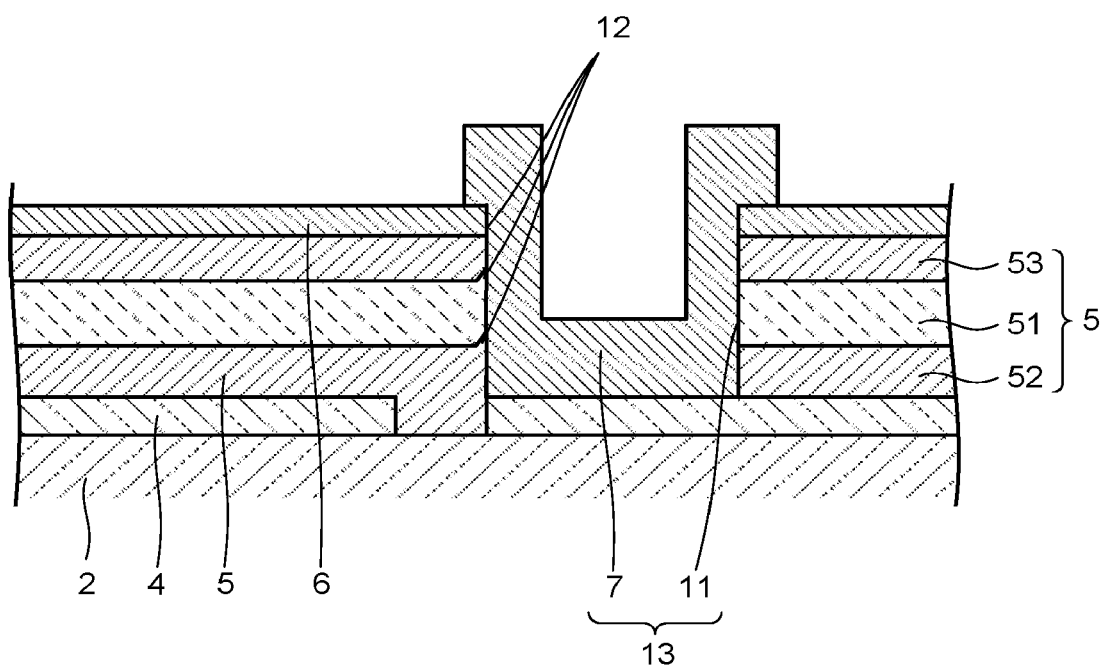
FIG. 5 is a cross-sectional schematic view illustrating another structural example of the connection.

The conducive parts 6a are not necessarily required to be formed in the dividing grooves 11A, 11B. FIG. 5 is a cross-sectional schematic view illustrating another structural example of the connection 13. Note that for parts similar to those in FIG. 1 and FIG. 2, the above-described explanation can be appropriately used. When a conductive portion 6a is not formed as illustrated in FIG. 5, a conductive layer 7 whose thickness is larger than a thickness of a counter electrode 6 overlaps the counter electrode 6 on an edge of a dividing groove 11. The conductive layer 7 further contacts a substrate electrode 4 and the counter electrode 6. Thereby, the substrate electrode 4 and the counter electrode 6 are electrically connected.

Another manufacturing method example of a photoelectric conversion device having the connection 13 illustrated in FIG. 5 will be described. FIG. 6A to FIG. 6D are schematic views for explaining a manufacturing method example of a photoelectric conversion device 1. Note that for parts similar to those in the manufacturing method example of the photoelectric conversion device referring to FIG. 3, the above-described explanation can be appropriately used.

Figure 6A:
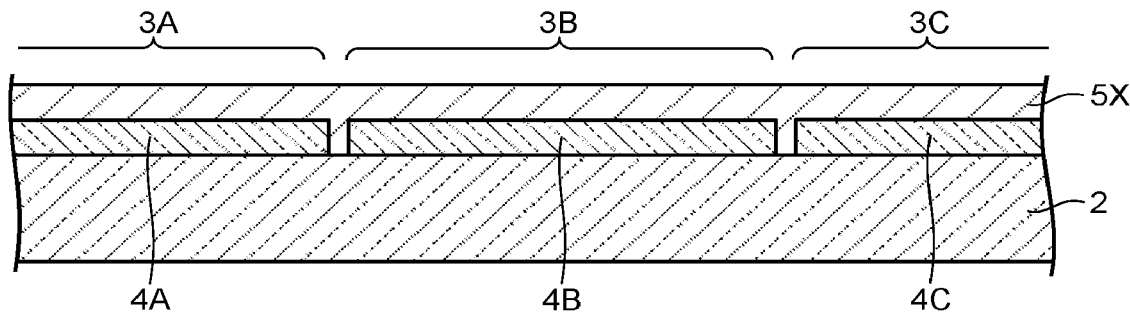
FIGS. 6A to 6D are cross-sectional views for exampling another manufacturing method example of the photoelectric conversion device.

In another manufacturing method example of the photoelectric conversion device 1, as illustrated in FIG. 6A, substrate electrodes 4A, 4B, 4C corresponding to a plurality of photoelectric conversion elements 3A, 3B, 3C are formed on a substrate 2. The substrate electrode 4B is formed in a state of being adjacent to the substrate electrode 4A and separate from the substrate electrode 4A, that is, in a state of being electrically insulated. Similarly, the substrate electrode 4C is formed in a state of being adjacent to the substrate electrode 4B and separate from the substrate electrode 4B, that is, in a state of being electrically insulated. A photoelectric conversion layer 5X is formed on the substrate 2 in a manner to overlap the substrate electrodes 4A, 4B, 4C. The photoelectric conversion layer 5X is formed on an entire surface to overlap all the substrate electrodes 4A, 4B, 4C.

Figure 6B:
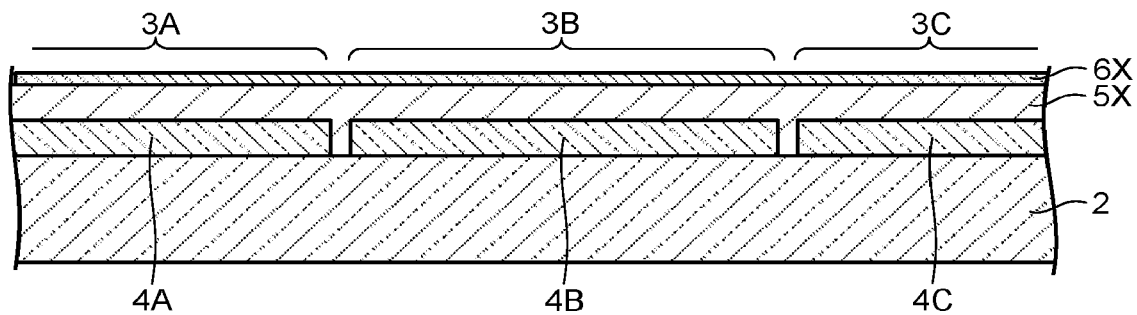

Next, as illustrated in FIG. 6B, a counter electrode 6X is formed on the photoelectric conversion layer 5X. A forming method of the counter electrode 6X is similar to that in the manufacturing method example of the photoelectric conversion device referring to FIG. 3.

Figure 6C:
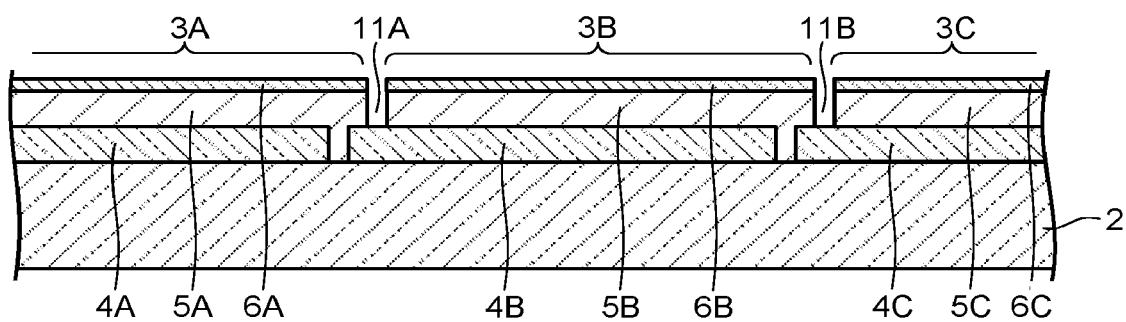

Next, as illustrated in FIG. 6C, the photoelectric conversion layer 5X and the counter electrode 6X are cut to form dividing grooves 11A, 11B so as to divide the photoelectric conversion layer 5X and the counter electrode 6X into a plurality of layers to correspond to the respective photoelectric conversion elements 3A, 3B, 3C. The dividing grooves 11A, 11B are formed by a scribing method such as mechanical scribing or laser scribing, for example. By dividing the photoelectric conversion layer 5X and the counter electrode 6X into the plurality of layers by the scribe grooves (dividing grooves) 11A, 11B, photoelectric conversion layers 5A, 5B, 5C and counter electrodes 6A, 6B, 6C corresponding to the plurality of photoelectric conversion elements 3A, 3B, 3C are formed. The dividing grooves 11A, 11B are forming regions of electrical connections 13 between the counter electrodes 6A, 6B of the photoelectric conversion elements 3A, 3B and the substrate electrodes 4B, 4C of the adjacent photoelectric conversion elements 3B, 3C. Therefore, the dividing grooves 11A, 11B are formed in a manner that surfaces of the substrate electrodes 4B, 4C are exposed.

Figure 6D:
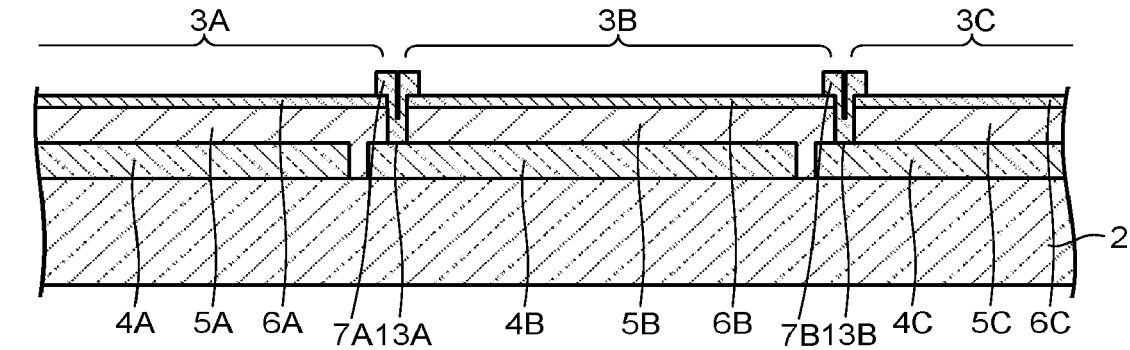

Next, as illustrated in FIG. 6D, conductive layers 7A, 7B are formed in the dividing grooves 11A, 11B provided between the adjacent photoelectric conversion elements 3A, 3B, 3C. In this way, the counter electrodes 6A, 6B of the photoelectric conversion elements 3A, 3B and substrates electrodes 4B, 4C of the adjacent photoelectric conversion elements 3B, 3C are electrically connected by the conductive layers 7A, 7B provided in the dividing grooves 11A, 11B.

As described above, it is possible to form a structure in which the conductive layers 7A, 7B overlap the counter electrodes 6 in edges of the dividing grooves 11 without forming the conductive portions 6a. Thereby, it is possible to lower a connection resistance between the counter electrode 6 and the substrate electrode 4 in the connection 13.

EXAMPLES

Example 1

A plurality of ITO layers of 150 nm in thickness were formed as substrate electrodes on a glass substrate. Eight ITO layers were formed in correspondence to the number of provided photoelectric conversion elements. In other words, the ITO layers were formed to correspond to an eight-series module. Next, conductive layers having a stacked structure of Mo and Au were formed in edge portions on left sides of the eight ITO layers. The Mo layer was used as an adhesive layer between the ITO layer and the Au layer. A width of the conductive layer was about 0.5 mm, and a thickness thereof was 350 nm (Mo layer: 50 nm, Au layer: 300 nm). The conductive layer was formed by a vacuum film forming method and patterned by a photolithography method, to thereby be formed only in the edge portion of the ITO layer. Next, PEDOT/PSS was formed as a substrate side intermediate layer. As the PEDOT•PSS, Clevios A14083 of Heraeus Corporation was used. A film thickness was about 50 nm.

Next, a perovskite layer was formed as an active layer. As a film forming method of the perovskite layer, a two-step method was used. As a coating solution for a first step, there was used a solution in which $PbI_2$ was dissolved in a 1:1 mixed solvent of dimethylformamide (DMF) and dimethylsulfoxide (DMSO). As a coating solution for a second step, there was used a solution in which $CH_3NH_3I$ (MAI) was dissolved in isopropyl alcohol (IPA). After the second step was finished, a heat treatment at 120° C. was performed for 5 minutes to form the active layer. A film thickness was about 350 nm.

Next, as a counter electrode side intermediate layer A, [0048]PCBM([6,6]-phenyl-C61-butyric acid methylester) was formed. As a solvent for [0049]PCBM ink, monochlorobenzene was used. After the [0050]PCBM ink was applied, spontaneous drying was done. A film thickness was about 50 nm.

Next, in order to connect segments in series, scribing was performed to a photoelectric conversion layer to thereby provide a through hole on the substrate electrode.

Next, as a counter electrode side intermediate layer B, a film was formed by vacuum depositing BCP (2,9-dimethyl-4,7-diphenyl-1,10-phenanthroline) in a thickness of about 20 nm. Next, as a counter electrode, a film was formed by vacuum deposing Ag in a thickness of about 150 nm.

Thereafter, to a scribed groove part, Ag was further deposited in a thickness of 150 nm to thereby form a conductive layer in a manner that its size becomes larger than a width of the scribe groove by about 100 μm.

Thereafter, scribing was performed to the counter electrode and the photoelectric conversion layer, to thereby separate cells. By the above steps, a photoelectric conversion module having a serial structure was formed. Consequently, a fill factor (FF) of an IV property was improved, alteration of a contact part at a time of an endurance test was also decreased, and a rise of a series resistance Rs was also able to be suppressed.

Example 2

A plurality of ITO layers of 150 nm in thickness were formed as substrate electrodes on a glass substrate. Eight ITO layers were formed in correspondence to the number of provided photoelectric conversion elements. In other words, the ITO layers were formed to correspond to an eight-series module. Next, conductive layers having a stacked structure of Mo and Au were formed in edge portions on left sides of eight ITO layers. The Mo layer was used as an adhesive layer between the ITO layer and the Au layer. A width of the conductive layer was about 0.5 mm, and a thickness thereof was 350 nm (Mo layer: 50 nm, Au layer: 300 nm). The conductive layer was formed by a vacuum film forming method and patterned by a photolithography method, to thereby be formed only in the edge portion of the ITO layer. Next, PEDOT/PSS was formed as a substrate side intermediate layer. As the PEDOT•PSS, Clevios A14083 of Heraeus Corporation was used. A film thickness was about 50 nm.

Next, a perovskite layer was formed as an active layer. As a film forming method of the perovskite layer, a two-step method was used. As a coating solution for a first step, there was used a solution in which $PbI_2$ was dissolved in a 1:1 mixed solvent of dimethylformamide (DMF) and dimethylsulfoxide (DMSO). As a coating solution for a second step, there was used a solution in which $CH_3NH_3I$ (MAI) was dissolved in isopropyl alcohol (IPA). After the second step was finished, a heat treatment at 120° C. was performed for 5 minutes to form the active layer. A film thickness was about 350 nm.

Next, as a counter electrode side intermediate layer A, AZO was applied and formed, and thereafter ITO was formed by sputtering.

Next, in order to connect segments in series, scribing was performed to a photoelectric conversion layer to thereby provide a through hole on the substrate electrode.

Next, as a counter electrode side intermediate layer B, a film was formed by vacuum depositing BCP in a thickness of about 20 nm. Next, as a counter electrode, a film was formed by vacuum deposing Ag in a thickness of about 150 nm.

Thereafter, to a scribed groove part, Ag was further deposited in a thickness of 150 nm to thereby form a conductive layer in a manner that its size becomes larger than a width of the scribe groove by about 100 μm.

Thereafter, scribing was performed to the counter electrode and the photoelectric conversion layer, to thereby separate cells. By the above steps, a photovoltaic module having a serial structure was formed. Consequently, a FF of an IV property was improved, alteration of a contact part at a time of an endurance test was also decreased, and a rise of a series resistance Rs was also able to be suppressed.

Example 3

Similarly to Example 1, an ITO substrate electrode, a substrate side intermediate layer, $CH_3NH_3PbI_3$(MAPbI$_3$), counter electrode side intermediate layers A, B were applied and formed on a glass substrate, scribing was performed to a photoelectric conversion layer in order to connect segments in series, a through hole was provided in the substrate electrode, and thereafter, ITO of 30 nm was formed by sputtering as a counter electrode, and the counter electrode and the substrate electrode were electrically connected via the through hole. Thereafter, to a scribed groove part, Ag was further deposited in a thickness of 150 nm to thereby form a conductive layer in a manner that its size becomes larger than a width of the scribe groove by about 100 μm. Thereafter, scribing was performed to the counter electrode and the photoelectric conversion layer, to thereby electrically separate cells. A photoelectric conversion module which is translucent in form and has an improved series resistance was realized.

Several embodiments of the present invention have been explained, but these embodiments have been presented by way of example only, and are not intended to limit the scope of the invention. Those embodiments can be embodied in a variety of other forms, and various omissions, substitutions and changes may be made without departing from the spirit of the invention. These embodiments and their modifications are included in the scope and gist of the invention and are included in the invention described in claims and their equivalents.

What is claimed is:

1. A photoelectric conversion device, comprising:
a substrate;
a first photoelectric conversion element including
a first substrate electrode provided on the substrate,
a first photoelectric conversion layer disposed on the first substrate electrode, and
a first counter electrode disposed on the first photoelectric conversion layer;
a second photoelectric conversion element including
a second substrate electrode provided adjacent to the first substrate electrode on the substrate and electrically insulated from the first substrate electrode,
a second photoelectric conversion layer disposed on the second substrate electrode, and
a second counter electrode disposed on the second photoelectric conversion layer; and
a connection including a groove, a conductive portion and a conductive layer, the groove penetrating the second photoelectric conversion layer from a surface to expose a surface of the second substrate electrode from the second photoelectric conversion layer, the conductive portion being provided in the groove and including a part of the first counter electrode, the conductive layer being provided on the conductive portion, and the conductive portion and the conductive layer electrically connecting the first counter electrode and the second substrate electrode, wherein
the first counter electrode contains silver,
the conductive layer contains silver,
the conductive layer extends along an inner wall surface of the groove and overlaps the first counter electrode on an edge of the groove, and a total thickness of the conductive portion and the conductive layer is larger than a thickness of the first counter electrode, and
an average thickness of the conductive layer is 30 nm or more and 150 nm or less.

2. The device according to claim 1, wherein the first counter electrode has a light transmittance of 10% or more.

3. The device according to claim 1, wherein
the second substrate electrode contains at least one conductive metal oxide selected from the group consisting of indium oxide, zinc oxide, tin oxide, indium tin oxide, fluorine-doped tin oxide, gallium-doped zinc oxide, aluminum-doped zinc oxide, indium-zinc oxide, and an indium-gallium-zinc oxide.

4. The device according to claim 1, wherein a width of the conductive layer is larger than a width of the groove.

5. The device according to claim 1, wherein
the photoelectric conversion layer has a perovskite compound represented by a composition formula: ABX3, where A denotes at least one cation selected from the group consisting of monovalent cations, B denotes at least one cation selected from the group consisting of divalent cations, and X denotes at least one selected from the group consisting of halogen anions.

6. A photoelectric conversion device, comprising:
a substrate;
a first photoelectric conversion element including
a first substrate electrode provided on the substrate,
a first photoelectric conversion layer disposed on the first substrate electrode, and
a first counter electrode disposed on the first photoelectric conversion layer;
a second photoelectric conversion element including
a second substrate electrode provided adjacent to the first substrate electrode on the substrate and electrically insulated from the first substrate electrode,
a second photoelectric conversion layer disposed on the second substrate electrode, and
a second counter electrode disposed on the second photoelectric conversion layer; and
a connection including a groove and a conductive layer, the groove penetrating the second photoelectric conversion layer from a surface to expose a surface of the second substrate electrode from the second photoelectric conversion layer, the conductive layer being provided in the groove and electrically connecting the first counter electrode and the second substrate electrode, wherein
the first counter electrode contains silver,
the conductive layer contains silver, the conductive layer extends along an inner wall surface of the groove and overlaps the first counter electrode on an edge of the groove and is thicker than the first counter electrode, and an average thickness of the conductive layer is 30 nm or more and 150 nm or less.

7. A method of manufacturing a photoelectric conversion device, comprising:

forming a first and a second substrate electrode onto a substrate, the second substrate electrode being adjacent to the first substrate electrode and electrically insulated from the first substrate electrode;

forming a photoelectric conversion layer onto the substrate to overlap the first substrate electrode and the second substrate electrode;

scribing the photoelectric conversion layer to form a groove penetrating the photoelectric conversion layer from a surface to expose a surface of the second substrate electrode from the photoelectric conversion layer;

forming a first and a second counter electrode respectively corresponding to the first and the second substrate electrode onto the photoelectric conversion layer divided by the groove while forming a conductive portion including a part of the first counter electrode into the groove; and forming a conductive layer onto the conductive portion, the conductive layer extending along an inner wall surface of the groove and overlapping the first counter electrode on an edge of the groove, a total thickness of the conductive portion and the conductive layer being larger than a thickness of the first counter electrode, the conductive portion and the conductive layer electrically connecting the first counter electrode and the second substrate electrode, wherein the first counter electrode contains silver, the conductive layer contains silver, and an average thickness of the conductive layer is 30 nm or more and 150 nm or less.

8. A method of manufacturing a photoelectric conversion device, comprising:

forming a first and a second substrate electrode onto a substrate, the second substrate electrode being adjacent to the first substrate electrode and electrically insulated from the first substrate electrode;

forming a photoelectric conversion layer onto the substrate and overlap the first and second substrate electrodes;

forming a counter electrode onto the photoelectric conversion layer;

scribing the photoelectric conversion layer and the counter electrode to form a groove penetrating the photoelectric conversion layer from a surface to expose a surface of the second substrate electrode from the photoelectric conversion layer, while to form a first counter electrode and a second counter electrode in correspondence to the first substrate electrode and the second substrate electrode; and forming a conductive layer into the groove, the conductive layer being thicker than the first counter electrode, the conductive layer extending along an inner wall surface of the groove and overlapping the first counter electrode on an edge of the groove, the conductive layer electrically connecting the first counter electrode and the second substrate electrode, wherein the first counter electrode contains silver, the conductive layer contains silver, and an average thickness of the conductive layer is 30 nm or more and 150 nm or less.

\* \* \* \* \*